(12) United States Patent
Berry et al.

(10) Patent No.: US 6,664,737 B1
(45) Date of Patent: Dec. 16, 2003

(54) DIELECTRIC BARRIER DISCHARGE APPARATUS AND PROCESS FOR TREATING A SUBSTRATE

(75) Inventors: Ivan Berry, Ellicott City, MD (US); Alan C. Janos, Darnestown, MD (US); Michael Bruce Colson, Woodbine, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/064,219

(22) Filed: Jun. 21, 2002

(51) Int. Cl.⁷ ................................................. H01J 7/24
(52) U.S. Cl. ............. 315/111.21; 315/246; 156/345.47; 134/1.1
(58) Field of Search ........................ 315/111.21, 111.34, 315/111.71, 246, 248; 156/345.33, 345.34, 345.36, 345.47; 134/1.1, 1.2, 1.3; 118/723 DC, 723 E

(56) References Cited

U.S. PATENT DOCUMENTS

| | | | |
|---|---|---|---|
| 5,015,331 A | * 5/1991 | Powell | 438/723 |
| 5,198,724 A | 3/1993 | Koinuma et al. | 315/111.21 |
| 5,369,336 A | 11/1994 | Koinuma et al. | 315/111.21 |
| 5,414,324 A | 5/1995 | Roth et al. | 315/111.21 |
| 5,415,719 A | * 5/1995 | Akimoto | 156/345.38 |
| 5,510,158 A | 4/1996 | Hiramoto et al. | 427/582 |
| 5,698,039 A | 12/1997 | Patz et al. | 134/1.1 |
| 5,763,892 A | 6/1998 | Kizaki et al. | 250/492.1 |
| 5,800,618 A | * 9/1998 | Niori et al. | 118/723 E |
| 5,882,424 A | * 3/1999 | Taylor et al. | 134/1.1 |
| 5,895,558 A | * 4/1999 | Spence | 204/164 |
| 5,900,103 A | * 5/1999 | Tomoyasu et al. | 315/111.21 |
| 2001/0022499 A1 | 9/2001 | Inayoshi | 313/607 |

* cited by examiner

Primary Examiner—James Clinger
Assistant Examiner—Ephrem Alemu
(74) Attorney, Agent, or Firm—Cantor Colburns LLP

(57) ABSTRACT

A dielectric barrier discharge apparatus for treating a substrate includes a first planar electrode; a dielectric layer disposed on a surface of the first planar electrode; a porous planar electrode spaced above and in a parallel plane with the dielectric layer, wherein the porous planar electrode has a geometric transmission factor greater than 70 percent; and a power supply in electrical communication with the first electrode and the second electrode. A process for treating a substrate includes exposing the substrate surface to reactants produced by the dielectric barrier discharge apparatus.

21 Claims, 1 Drawing Sheet

DIELECTRIC BARRIER DISCHARGE APPARATUS AND PROCESS FOR TREATING A SUBSTRATE

BACKGROUND OF INVENTION

The present disclosure relates to a reactor assembly for processing substrates and more particularly, to a distribution system for flowing gases and/or reactants into and out of the reactor assembly process and apparatus for treating a substrate and, more particularly, to a dielectric barrier discharge apparatus and processes for treating a surface of the substrate.

Plasmas and plasma generation have been studied for many years. There are several types of plasma generators currently employed for numerous applications. A large majority of these plasma generators require vacuum systems that operate at about 1 to about 10 torr and employ sophisticated, expensive plasma sources such as microwave plasma generators as used in many downstream plasma ashers, radio frequency(rf) plasma generators, combinations comprising at least one of the foregoing plasma sources, and the like.

Other types of plasma generators are designed to operate at atmospheric pressures, which avoid the use, complexity, and cost of the aforementioned vacuum and plasma systems. However, atmospheric plasma tools are generally limited in spatial extent(on the order of a few centimeters) requiring various techniques such as wafer rotation or scanning of the plasma source to overcome this limitation and provide uniform ashing.

In atmospheric plasma tools, the plasma is typically generated from arcs across spaced apart electrodes. For example, in U.S. Pat. No. 5,414,324 for "One Atmosphere, Uniform Glow Discharge Plasma," a one-atmosphere, steady-state glow discharge plasma generated between a pair of insulated, equally spaced planar metal electrodes energized with an rms potential of 1 to 5 kV at 1 to 100 kHz is described. The patentees state that glow discharge plasmas are produced by free electrons, which are energized by imposed direct current or rf electric fields. These electrons collide with neutral molecules transferring energy thereto, thereby forming a variety of active species that may include metastables, atomic species, free radicals, molecular fragments, monomers, electrons, and ions. An environmental isolation enclosure in which a low feed gas flow is maintained surrounds the plate assembly in order to equal the leakage rate of the enclosure. In fact, a no flow condition is taught for normal operation of the apparatus. Materials are processed by passing them through the plasma between the electrodes, where they are exposed to all plasma constituents including ions. The use of bare electrodes inevitably introduces particles that can deleteriously compromise the integrity of the circuits produced on the wafers. Additionally, the electrical currents (DC or AC) may damage the devices being manufactured on the substrate, e.g., wafer, causing lower yields.

Another type of atmospheric plasma discharge apparatus includes dielectric discharge barrier apparatuses. The dielectric barrier discharge apparatus generally includes two parallel electrodes with a dielectric-insulating layer disposed on or between one of the electrodes and operate at about atmospheric pressures. The dielectric barrier discharge apparatus does not provide one single plasma discharge, but instead provides a series of short-lived, self terminating arcs, which on a long time scale (greater than a microsecond), appears as a stable, continuous, and homogeneous plasma. The dielectric layer serves to ensure termination of the arc. The wafer to be treated is often used as one of the planar electrodes or typically is placed between two planar electrodes. In either scenario, the discharges generated by the dielectric discharge barrier apparatus pass through the wafer, thereby damaging the circuitry previously formed in the wafer or causing localized variations in the ashing rate.

In U.S. Pat. Nos. 5,198,724 and 5,369,336, the patentees describe an apparatus that includes a central electrode, a peripheral cylindrical electrode surrounding the central conductor, and an insulating cylinder interposed between the electrodes in order to prevent direct arc discharge from occurring therebetween. The electrodes and the insulating cylinder are coaxially arranged in order to define a cylindrical discharging space therein. By applying high-frequency electrical energy to the central electrode, a glow discharge is caused to occur between the central electrode and the insulating cylinder. A reactive gas is introduced from one end of the discharge space, excited by the glow discharge and exits from the other end as excited plasma impinging on a work piece to be processed by the plasma. However, the apparatus cannot be scaled to large dimensions since the insulating cylinder must remain thin because it is required to conduct the radio frequency discharge current. Further, the dielectric material is subject to attack by the reactive gases, and introduces a phase lag, which requires that higher voltages and lower currents must be employed to maintain the discharge.

Another problem with this type of atmospheric plasma discharge apparatus is specific to the manufacture of semiconductor devices. Providing even distribution of the reactants onto the surface of the semiconductor substrate is desired. Because the discharge tubes of these create reactants, which move radially in all directions, they do not provide, even application of reactants in a particular desired direction. This is because the reactants concentration is altered by its passing through the elements of the device, such as quartz tubes, electrodes, and by being absorbed by the emitter gas itself. The reactants not reaching the wafer are therefore wasted. Additionally, the geometry of cylindrical emitters with a central electrode surrounded by the other electrode inherently produces uneven reactants. Uneven distribution of reactants results in uneven exposure to the flat wafer, thereby resulting in uneven treatment of the surface, thereby reducing the precision and consistency of the exposure of a semiconductor wafer to the reactants.

Attempts in the prior art to overcome uneven distribution include apparatuses wherein the semiconductor substrate is used as one of the planar electrodes or resides between planar electrodes. However, these types of prior art devices suffer from the same problem of localized loss of dielectric efficacy and uneven plasma generation. Additionally, with many of the prior art devices, there is no means for cooling the electrodes, and further degradation of the dielectric material and heating of the gas results in inefficiency and short useful device lifetime.

In those dielectric discharge barrier apparatuses that employ a screen electrode or grid, the screen electrode or grid typically comprises a woven metal lattice pattern. The problem with these types of screen electrodes is that the overlapping wires of the woven pattern provide only a few arc sites. The areas of overlap closest to the dielectric layer provide arc sites whereas the areas of overlap farthest from the dielectric layer generally do not arc at the voltages employed, greatly reducing the efficiency of the plasma as a source for reactants.

SUMMARY OF INVENTION

Disclosed herein are a dielectric discharge apparatus and process for treating a substrate. The dielectric barrier discharge apparatus comprises a first planar electrode; a dielectric layer disposed on a surface of the first planar electrode; a second planar electrode spaced above in a parallel plane with the dielectric layer, wherein the second planar electrode comprises a porous structure having a nominal thickness and a geometric transmission factor greater than about 70 percent; and a power supply in electrical communication with the first electrode and the second electrode.

In another embodiment, the apparatus comprises a first planar electrode; a dielectric layer disposed on a surface of the first planar electrode; a second planar electrode spaced above and in a parallel plane with the dielectric layer, wherein the second planar electrode comprises a porous structure; a substrate spaced above in a parallel plane with the second planar electrode and at a distance less than or equal to about 10 millimeters from the second planar electrode; and a power supply in electrical communication with the first electrode and the second electrode.

A process for treating a substrate comprises introducing a substrate to be treated into a chamber, wherein the. chamber comprises a dielectric barrier discharge apparatus comprising a first planar electrode, a dielectric layer disposed on the first planar electrode, a second planar electrode spaced above and in a parallel plane with the dielectric layer, and a power supply in electrical communication with the first and second planar electrodes, wherein the second planar electrode is porous and has a geometric transmission factor greater than about 70 percent, and wherein introducing the substrate comprises positioning the substrate above the second planar electrode in a parallel plane and at a distance less than or equal to about 10 millimeters from the second planar electrode; flowing an oxygen containing fluid between the first and second electrodes at about an atmospheric pressure; pulsing the power supply to the electrodes and generating a plasma comprising reactive species between the first planar electrode and the second planar electrode; and reacting the reactive species with the substrate.

The above described and other features are exemplified by the following figures and detailed description.

BRIEF DESCRIPTION OF DRAWINGS

Referring to the exemplary drawings wherein like elements are numbered alike in the several Figures.

DETAILED DESCRIPTION

Figure 1:
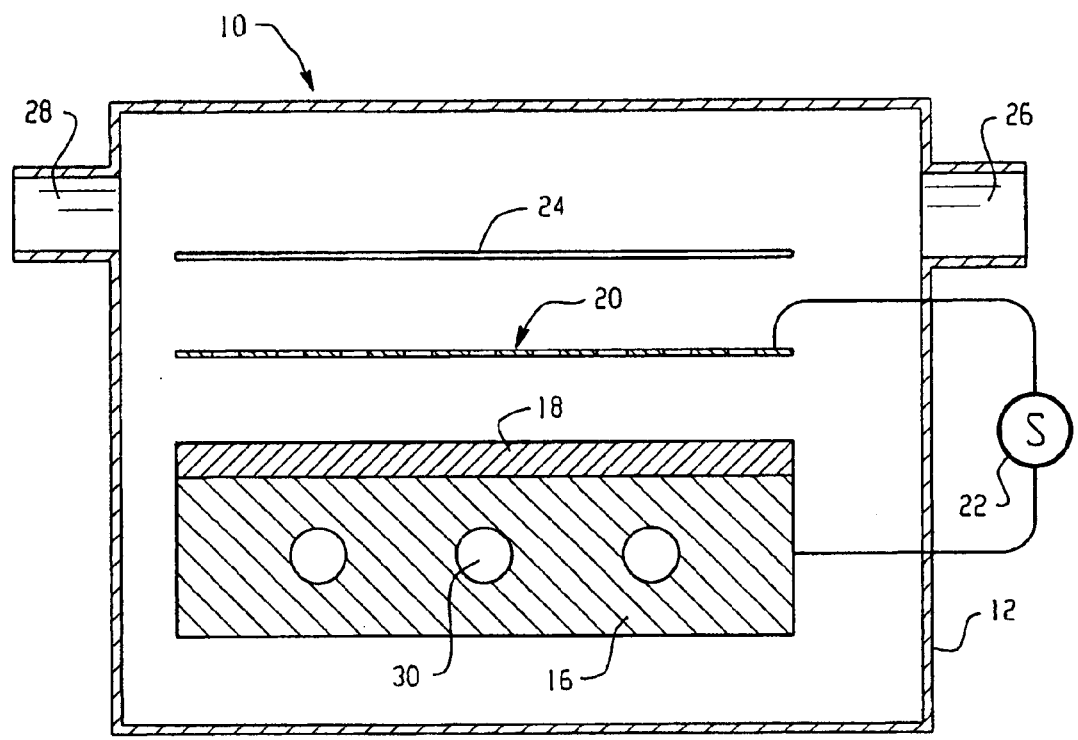
FIG. 1 is a cross sectional view of a dielectric barrier discharge apparatus.

FIG. 1 is a schematic illustration of an apparatus 10 suitable for treating a surface of a substrate. The apparatus 10 includes a chamber 12 housing a dielectric barrier discharge apparatus. The dielectric barrier discharge apparatus generally includes a base electrode 16, a dielectric layer 18 disposed on the base electrode 16, and a screen electrode 20 spaced above and preferably, at a parallel plane with the base electrode 16 and dielectric layer 18. A power supply 22 provides electrical communication to the base electrode 16 and the screen electrode 20. During operation, a substrate 24 is placed above and at a parallel plane with the screen electrode 20 by means of a robotic wafer handler (not shown) or the like.

The chamber 12 includes a gas inlet opening 26 and an exhaust opening 28. The locations of each are exemplary and the locations of the gas inlet 26 and exhaust opening 28 within the chamber 12 can vary. For example, instead of being disposed in a chamber wall, the gas inlet 26 may comprise one or more fluid passageways disposed within the base electrode and dielectric layer, thereby allowing a gas to flow towards the screen electrode 20 and substrate 24. The particular gases utilized will depend on the particular treatment being performed. Preferably, an oxygen containing fluid or combinations of gases including an oxygen containing fluid is used. For example, the apparatus 10 can be used for removing, i.e., ashing, a photoresist layer disposed on a substrate surface. Ozone, singlet oxygen, and/or atomic oxygen can be produced by the apparatus from air or from an oxygen containing fluid. The respective quantities of these produced species will depend on numerous parameters, and in particular, the temperature of the gas (depending on the flow rate of the gas for a given power) and the frequency of the power source 22. The temperature of the gas determines the degree of ultimate destruction of the ozone, and hence the evolution of atomic oxygen, and the frequency influences the energy of the electrons and thus the excitation and dissociation of molecular oxygen. The frequency also determines how many times the discharges are allowed to occur, thus determining the concentration of reactants. The chamber 12 is preferably fabricated from a non-conductive material that is inert to the processing environment including the reactive species.

The base electrode 16 may be made of any conductive material based primarily on the intended use of the dielectric discharge apparatus, costs, and chemical stability. For example, the base electrode 16 may be made of stainless steel, steel, monel, aluminum, ruthenium, iridium, titanium, tantalum, oxides of at least one of the foregoing metals, combinations including at least one of the foregoing metals, and the like. In one embodiment, the base electrode 16 includes at least one fluid passageway 30. The fluid passageway 30 may be configured for cooling the base electrode 16 during operation, and/or for flowing gas into the chamber 12 as previously described. In cooling the base electrode 16, a refrigerated medium such as water or the like is circulated in the fluid passageway. The shape of the base electrode 16 is preferably chosen to be congruent with a shape of the substrate 24 being processed, e.g., circularly shaped in the case of circularly shaped substrates such as wafers. Preferably, the base electrode 16 includes a planar surface.

The dielectric layer 18 comprises an insulating material that is disposed on the base electrode 16. Suitable insulating materials include silicon dioxide, silicon nitride, tetraethylorthosilicate, quartz, combinations comprising at least one of the foregoing dielectric materials, and the like. The dielectric layer 18 may be affixed to the base electrode 16 with an adhesive, coated, deposited, thermally grown, or the like. Suitable coating processes include spin coating, roller coating, dip coating, and the like. The dielectric layer 18 may also be deposited using such deposition and thermal processes as chemical vapor deposition (CVD), plasma enhanced CVD, rapid thermal processing, and the like. The thickness of the dielectric layer 18 is preferably chosen to provide a sufficient dielectric breakdown voltage to initiate plasma microfilament formation and excitation of a gas within the space between the dielectric layer 18 and electrode 20, which, in turn, depends on the potential between the screen electrode 20 and the base electrode 16. For example, the dielectric layer 18 should have a thickness such that when a current is applied to the base electrode 16 and the screen electrode 20, multiple electrical discharges begin ionizing the gas within the chamber into a plasma and producing radicals. Meanwhile, however, those discharges are charging up the dielectric layer 18 (either negatively or positively, depending on the polarity). That lowers the electric field in the gas, eventually quenching the microdischarges before they can escalate enough to collapse into an arc. The thickness of the dielectric layer 18 is selected based on the applied current and is selected to prevent the formation of the arc across the electrodes. As previously discussed, microelectronic devices are susceptible to damage from contact with the arc and preventing the arc from contacting the substrate is most preferred.

Figure 2:
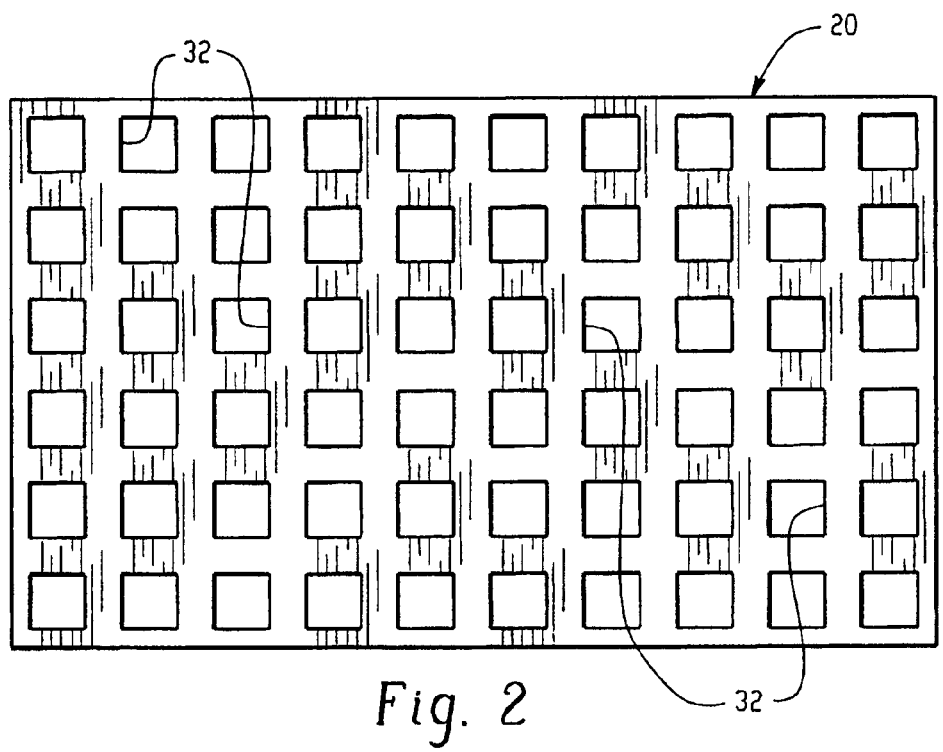
FIG. 2 is a perspective view of an exemplary screen electrode.

The problem of uneven plasma formation is minimized by the use of the screen electrode 20, as shown more clearly in the top plan view of FIG. 2. The screen electrode 20 may be fabricated from the same materials as the base electrode 16. The screen electrode 20 preferably has a nominal thickness and is fabricated from a single sheet of conductive material. More preferably, the screen electrode has an absolute thickness. A lattice network of orifices 32 is formed in the sheet by etching, stamping, or the like. In a preferred embodiment, etching forms the orifices 32. In this manner, the lattice network of the screen electrode 20 preferably has a geometric transmission factor greater than 70%, with greater than 80% more preferred, and with greater than 90% even more preferred. The term "geometric transmission factor" is defined as the fractional area of holes relative to the entire screen area. For exemplary purposes, a geometric transmission factor of about 92% is obtained by etching a plurality of square shaped orifices, each orifice having an area of 0.090 inches×0.090 inches with a wire width of 0.004 inches and a nominal sheet thickness of a 0.004 inches. The screen electrode 20 (wires) provides formation sites for plasma microfilaments. By providing many such sites of plasma microfilament formation, there is a decreased tendency for the plasma to be progressively formed at only a few sites within the discharge space. Consequently, the plasma will be more evenly distributed.

The exact shapes and dimensions of the orifices 32 can vary, but orifices 32 are preferred which have sharp corners or edges, which allows discharges to initiate at and away from intersections. As a result, discharges are based more on the local gas conditions in the chamber 12.

The screen electrode 20 is suspended above the dielectric layer 16 at a distance effective to allow reactants generated the discharge region between the screen electrode 20 and dielectric layer 16 to reach the substrate surface 24. Preferably, the distance between the screen electrode 20 and the dielectric layer 18 is equal to or less than about 5 millimeters (mm), with less than or equal to about 3 mm more preferred, and with less than or equal to about 2 mm even more preferred. The screen electrode 20 can be rigid or flexible depending on the desired application. However, in a preferred embodiment, the screen electrode 20 is maintained flat during operation and equally spaced from the base electrode 16 at substantially every point, i.e., the screen electrode is at a parallel plane to the base electrode.

The power supply 22 preferably comprises a high voltage, low current, and high frequency capability. Such electrical devices are well known in the art and will not be described further. During operation, the power supply 22 is connected to the electrodes 16, 20 and is preferably periodically pulsed since most reactants are believed to be produced during the first few nanoseconds or microseconds of discharge. The power supply preferably provides a pulse at frequencies preferably varying from about 1 kHz to about several MHz. More preferably, the frequency is at about 2 kHz or more. The power necessary to initiate plasma discharge across the gap between electrodes 16, 20 can vary depending on the desired efficiency. Preferably, the power is greater than about 100 watts to about several kilowatts. The voltages applied to the electrodes are preferably in the about 500 volts (V) to about 10 kilovolts (kV) range. More preferably, the voltages applied between the electrodes are in the range of about 2 to about 3 kV. Further miniaturization of the electrodes 16, 20 and closer spacing can decrease the required power.

The substrate 24 to be treated is preferably disposed from the screen electrode 20 at a distance effective for the reactive species to contact the substrate surface 24. In a preferred embodiment, the substrate 24 is at a distance less than or equal to about 1 mm, with less than or equal to about 5 mm even more preferred, and with less than or equal to about 2 mm most preferred. At distances greater than about 20 mm it is expected that efficiency will exponentially decrease because of the propensity of the reactants to recombine especially at about or greater than about atmospheric pressure.

During operation, the screen electrode 20 is preferably at ground potential. Additionally, the substrate 24 and its holder, e.g., robotic arm, would also preferably be at ground potential. Such operation minimizes the potential to damage the substrate 24. If the apparatus is operated in this mode, the base electrode is preferably isolated from the ground by high voltage insulation techniques such as with a G-10 fiberglass impregnated insulating block. During a pulse, when a sufficient electric field is applied across the space between the electrodes 16, 20, the rate of ionization is believed to exceed the rate of electron attachment and forms a so-called streamer for depositing a charge onto the surface of the dielectric layer 18. In this manner, a radial electric field is created which serves to spread the charge out into surface discharges on the surface of the dielectric. Without the presence of the dielectric layer 18, the initial discharge would likely develop into a single thermal arc across the electrodes 16, 20. Instead, the accumulation and/or depletion of electrons on/from the dielectric layer 18 reduces the local electric field such that the rate of attachment dominates the rate of ionization thereby extinguishing the so-called streamer. Since the process of charge formation and extinction generally occurs within a few nanoseconds or microseconds, the resulting plasma does not reach thermal equilibrium with high energy electrons, even at non-atmospheric pressures, e.g. 100 mbar to several atmospheres.

Each discharge formed in the dielectric layer 18 occurs in a relatively small area believed to be about 100 microns in diameter. A large number of these discharges for each applied pulse from the power supply provides a uniform plasma source. Each discharge is independent from the other.

Although reference has been made to the use of atmospheric pressure, it has been unexpectedly found that increasing the pressure increases the reactivity. Moreover, the substrate may be heated during plasma processing to further increase the reactivity rate. The apparatus also produces UV radiation, which can have a variety of effects on both the gas within the chamber and the substrate surface to be treated. Ultraviolet production in the discharge can be enhanced by the use of a gas with accessible emission lines (in the UV) for the operating mode of the discharge. Proper electrode geometry with metal faced electrodes reflective to UV, and a dielectric barrier transparent to UV, will enhance the UV levels in the gas discharge.

The following examples are presented for illustrative purposes only, and are not intended to limit the scope of the disclosure.

EXAMPLE

In this example, the apparatus of FIG. 1 was employed to treat a substrate having a 2.4 microns thick photoresist layer coated thereon. The substrate was oriented such that the photoresist layer was facing the screen electrode at a distance of 2 mm from the screen electrode. The distance between the screen electrode and the dielectric layer was 1.6 millimeters. The screen electrode was chosen to have a geometric transmission factor of about 92% and was supported at each corner and held in a parallel plane with the dielectric layer. The dielectric layer was fabricated from a thin sheet of quartz glued to the base electrode, and ground and polished to a final thickness of 0.38 mm. Power input to the electrodes was less than about 25 watts. Ambient air at about atmospheric pressure was introduced into the chamber.

An ozone detector was positioned above the screen electrode during operation in an area unimpeded by the substrate and at a similar distance as the substrate. The ozone detector detected measurable amounts of ozone during operation, thereby indicating that the cell is producing derivatives from molecular oxygen from the air and that the reactants diffused upwards.

The photoresist ashing rate, i.e., removal rate of the photoresist from the substrate, was monitored and determined to be approximately 82 angstroms per minute (Å/min). Interestingly since air constitutes about 20.9% oxygen, it is believed that the ashing rate can be increased by about 478% by replacing the ambient air with pure oxygen. A change of this type would translate to an ashing rate of about 392 Å/min under the same operating conditions. It is further believed that increasing the power input to the cell from 25 W to about 1 kilowatt would further increase the ashing rate about an additional 40 times translating to an ashing rate of about 15,700 Å/min.

The dielectric barrier discharge apparatus described herein advantageously provides, among other things, high uniformity of reactant production without the need for plasma scanning or rotation of the substrate, a relatively high ashing rate due in part to the uniformity of reactant production provided by the apparatus, and permits lower operating temperatures. The ashing rates obtained with the dielectric barrier discharge apparatus are comparable to vacuum mediated ashing tools but at a much lower cost and complexity. Atmospheric ashing occurs without subjecting the substrates to an arc or an electric current. Moreover, the dielectric barrier discharge apparatus provides a significant commercial advantage since there are no costs associated with magnetrons, microwave guides, rf sources, and the like, or associated vacuum systems.

The screen electrode of the dielectric barrier discharge apparatus provides, for all intents and purposes, an infinite plane of closely spaced multiple point sources. Because of the sharp and clean edges provided by the screen electrode as well as the uniform thickness and constant gap distance between the screen electrode and the dielectric layer, arc initiator sites are provided all along the lattice network, both at and away from the intersections. Prior art types of screen electrodes would have a woven overlapping wire structure and as a result, have inherently poor efficiency. Moreover, overlapping wire essentially doubles the effective height of the screen. Having a constant screen thickness permits one to fabricate much thinner screen electrodes. Moreover, the screen electrode described herein has a high geometric transmission factor compared to prior art screen electrodes. The high geometric transmission factor, e.g., greater than about 75%, provides greater efficiency and uniformity of the plasma discharges.

Advantageously, the dielectric barrier discharge apparatus and process can be employed to generate reactants for ashing, etching, and the like. Moreover, adjusting the pressure can be used to obtain a desired reactivity rate. Although specific reference has been made to oxygen containing fluids, other gases can be employed in combination with the oxygen containing fluid and/or for generating different reactive species depending on the particular application. The apparatus and process provide greater uniformity of reactants to the substrate and, consequently, provide improved cross wafer uniformity.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A dielectric barrier discharge apparatus, the apparatus comprising:
   a first planar electrode;
   a dielectric layer disposed on a surface of the first planar electrode;
   a second planar electrode spaced above and in a parallel plane with the dielectric layer, wherein the second planar electrode comprises a porous structure having a nominal thickness and a geometric transmission factor greater than about 70 percent; and
   a power supply in electrical communication with the first electrode and the second electrode.

2. The dielectric barrier discharge apparatus according to claim 1, wherein the second planar electrode has a geometric transmission factor greater than about 80 percent.

3. The dielectric barrier discharge apparatus according to claim 1, wherein the second planar electrode has a geometric transmission factor greater than about 90 percent.

4. The dielectric barrier discharge apparatus according to claim 1, further comprising a substrate spaced above and in a parallel plane with the second planar electrode at a distance less than or equal to about 10 millimeters from the second planar electrode.

5. The dielectric barrier discharge apparatus according to claim 1, wherein the first planar electrode includes at least one fluid passageway.

6. The dielectric barrier discharge apparatus according to claim 1, further comprising a substrate spaced above and in a parallel plane with the second planar electrode at a distance less than or equal to about 5 millimeters from the second planar electrode.

7. The dielectric barrier discharge apparatus according to claim 1, wherein the second planar electrode comprises a plurality of squared shaped orifices.

8. The dielectric barrier discharge apparatus according to claim 1, further comprising a substrate spaced above and in a parallel plane with the second planar electrode at a distance less than or equal to about 2 millimeters from the second planar electrode.

9. The dielectric barrier discharge apparatus according to claim 1, wherein the second planar electrode is at ground potential.

10. The dielectric barrier discharge apparatus according to claim 1, wherein the second planar electrode has an absolute thickness.

11. The dielectric barrier discharge apparatus according to claim 1, wherein the second planar electrode is adjustably spaced above the first planar electrode.

12. An apparatus comprising:
a first planar electrode;
a dielectric layer disposed on a surface of the first planar electrode;
a second planar electrode spaced above and in a parallel plane with the dielectric layer, wherein the second planar electrode comprises a porous structure;
a substrate spaced above in a parallel plane with the second planar electrode and at a distance less than or equal to about 10 millimeters from the second planar electrode; and
a power supply in electrical communication with the first electrode and the second electrode.

13. The apparatus according to claim 12, wherein the substrate is at a distance less than or equal to about 5 millimeters from the second planar electrode.

14. The apparatus according to claim 12, wherein the substrate is at a distance less than or equal to about 2 millimeters from the second planar electrode.

15. The apparatus according to claim 12, wherein the substrate and the second planar electrode are at ground potential.

16. A process for treating a substrate, the process comprising:

introducing a substrate to be treated into a chamber, wherein the chamber comprises a dielectric barrier discharge apparatus comprising a first planar electrode, a dielectric layer disposed on the first planar electrode, a second planar electrode spaced above and in a parallel plane with the dielectric layer, and a power supply in electrical communication with the first and second planar electrodes, wherein the second planar electrode is porous and has a geometric transmission factor greater than about 70 percent, and wherein introducing the substrate comprises positioning the substrate above the second planar electrode in a parallel plane and at a distance less than or equal to about 10 millimeters from the second planar electrode;

flowing an oxygen containing fluid between the first and second electrodes at about an atmospheric pressure;

pulsing the power supply to the electrodes and generating a plasma comprising reactive species between the first planar electrode and the second planar electrode; and reacting the reactive species with the substrate.

17. The process according to claim 16, further comprising increasing the pressure within the chamber to increase a reaction rate.

18. The process according to claim 16, wherein periodically pulsing the power supply comprises a frequency greater than about 2 kilohertz.

19. The process according to claim 16, further comprising grounding the substrate and the second planar electrode.

20. The process according to claim 16, wherein the oxygen containing fluid comprises oxygen, an inert gas.

21. The process according to claim 16, wherein the distance between the screen electrode and the base electrode is adjustable.

* * * * *